United States Patent
Do et al.

(10) Patent No.: US 9,142,461 B2
(45) Date of Patent: *Sep. 22, 2015

(54) METHODS OF FABRICATING SEMICONDUCTOR DEVICES

(71) Applicant: Samsung Electronics Co., Ltd., Suwon-Si, Gyeonggi-Do (KR)

(72) Inventors: Jinho Do, Yongin-si (KR); Hajin Lim, Seoul (KR); WeonHong Kim, Suwon-si (KR); Kyungil Hong, Suwon-si (KR); Moonkyun Song, Anyang-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 14/289,076

(22) Filed: May 28, 2014

(65) Prior Publication Data

US 2014/0273382 A1    Sep. 18, 2014

Related U.S. Application Data

(62) Division of application No. 13/423,748, filed on Mar. 19, 2012, now Pat. No. 8,778,753.

(30) Foreign Application Priority Data

Mar. 22, 2011 (KR) .................. 10-2011-0025474

(51) Int. Cl.
*H01L 21/336* (2006.01)
*H01L 21/8234* (2006.01)
(Continued)

(52) U.S. Cl.
CPC .. *H01L 21/823462* (2013.01); *H01L 21/26506* (2013.01); *H01L 21/2822* (2013.01);
(Continued)

(58) Field of Classification Search
CPC ............. H01L 21/0254; H01L 21/02667; H01L 21/8238; H01L 21/8239; H01L 29/66734; H01L 21/823462; H01L 21/26506; H01L 21/28185; H01L 21/2822; H01L 21/823807; H01L 21/823814; H01L 29/1054; H01L 29/165; H01L 29/66575; H01L 29/66636; H01L 29/78; H01L 29/7848
USPC ......... 438/285, 229, 199, 222, 217, 602, 518, 438/592, 197, 515, 510, 786, 157, 216; 257/411, 204, 369, 19, 75, 288
See application file for complete search history.

(56) References Cited

U.S. PATENT DOCUMENTS 6,174,775 B1   1/2001   Liaw
6,521,527 B1   2/2003   Kuroi et al.
(Continued)

FOREIGN PATENT DOCUMENTS

JP   2004022902 A   1/2004
JP   2009252842 A   10/2009
(Continued)

OTHER PUBLICATIONS

Wu, Nan et. al. "Effect of Surface NH3 Anneal on the Physical and Electrical Properties of HfO2 Films on Ge Substrate." Applied Physics Letters. vol. 84, No. 19. 10 May 204. pp. 3741-3743.

*Primary Examiner* — Mohammed Shamsuzzaman
(74) *Attorney, Agent, or Firm* — Harness, Dickey & Pierce, P.L.C

(57) ABSTRACT

A substrate including an NMOS transistor region and a PMOS transistor region is prepared. A silicon-germanium layer is formed on the PMOS transistor region. Nitrogen atoms are injected in an upper portion of the silicon-germanium layer. A first gate dielectric layer is formed on the NMOS transistor region and the PMOS transistor region. The nitrogen atoms are injected into the upper portion of the silicon-germanium layer before forming the first gate dielectric layer.

6 Claims, 11 Drawing Sheets

(51) Int. Cl.
  *H01L 21/265* (2006.01)
  *H01L 21/8238* (2006.01)
  *H01L 29/10* (2006.01)
  *H01L 29/165* (2006.01)
  *H01L 29/66* (2006.01)
  *H01L 29/78* (2006.01)
  H01L 21/28 (2006.01)

(52) U.S. Cl.
  CPC  *H01L21/823807* (2013.01); *H01L 21/823814* (2013.01); *H01L 29/1054* (2013.01); *H01L 29/165* (2013.01); *H01L 29/66575* (2013.01); *H01L 29/66636* (2013.01); *H01L 29/78* (2013.01); *H01L 29/7848* (2013.01); *H01L 21/28185* (2013.01)

(56) References Cited

U.S. PATENT DOCUMENTS

| | | |
|---|---|---|
| 6,596,599 B1 | 7/2003 | Guo |
| 6,706,581 B1 | 3/2004 | Hou et al. |
| 6,716,695 B1 | 4/2004 | Hattangady et al. |
| 6,924,182 B1 | 8/2005 | Xiang et al. |
| 6,960,502 B2 | 11/2005 | Yamaguchi |
| 7,030,002 B2 | 4/2006 | Tweet et al. |
| 7,084,051 B2 | 8/2006 | Ueda |
| 7,098,154 B2 | 8/2006 | Yoneda |
| 7,235,469 B2 | 6/2007 | Okayama et al. |
| 7,449,753 B2* | 11/2008 | Wang et al. ............... 257/369 |
| 7,491,630 B2 | 2/2009 | Shroff et al. |
| 7,811,891 B2 | 10/2010 | Orlowski et al. |
| 8,003,503 B1 | 8/2011 | Clark |
| 8,247,282 B2* | 8/2012 | Kronholz et al. ............. 438/199 |
| 8,815,673 B2* | 8/2014 | Do et al. .................... 438/199 |
| 2001/0015922 A1 | 8/2001 | Ponomarev |
| 2003/0010980 A1 | 1/2003 | Yamazaki et al. |
| 2003/0232468 A1 | 12/2003 | Ohnuma |
| 2004/0018701 A1 | 1/2004 | Ueda |
| 2004/0164318 A1 | 8/2004 | Lee et al. |
| 2004/0201023 A1 | 10/2004 | Yamazaki et al. |
| 2004/0266116 A1 | 12/2004 | Mears et al. |
| 2005/0124121 A1 | 6/2005 | Rotondaro et al. |
| 2005/0181592 A1 | 8/2005 | Tweet et al. |
| 2005/0224897 A1 | 10/2005 | Chen et al. |
| 2005/0287759 A1 | 12/2005 | Wang et al. |
| 2006/0081836 A1 | 4/2006 | Kimura et al. |
| 2006/0131675 A1 | 6/2006 | Wang et al. |
| 2006/0166424 A1 | 7/2006 | Schaeffer et al. |
| 2006/0273410 A1 | 12/2006 | Park et al. |
| 2007/0020827 A1* | 1/2007 | Buh et al. .................... 438/157 |
| 2007/0166970 A1 | 7/2007 | Triyoso et al. |
| 2007/0196988 A1 | 8/2007 | Shroff et al. |
| 2007/0218661 A1 | 9/2007 | Shroff et al. |
| 2007/0298557 A1 | 12/2007 | Nieh et al. |
| 2007/0298565 A1* | 12/2007 | Nieh et al. .................... 438/222 |
| 2008/0023732 A1 | 1/2008 | Felch et al. |
| 2008/0042212 A1 | 2/2008 | Kamath et al. |
| 2008/0132039 A1 | 6/2008 | Cho et al. |
| 2008/0145985 A1 | 6/2008 | Chi |
| 2008/0308881 A1 | 12/2008 | De Gendt et al. |
| 2009/0108377 A1* | 4/2009 | Chen et al. ................... 257/411 |
| 2009/0140354 A1 | 6/2009 | Shin |
| 2009/0170256 A1 | 7/2009 | Chakravarthi et al. |
| 2009/0242958 A1* | 10/2009 | Kikuchi et al. ............... 257/319 |
| 2009/0286387 A1 | 11/2009 | Gilmer et al. |
| 2010/0022077 A1 | 1/2010 | Krull et al. |
| 2010/0025743 A1* | 2/2010 | Hoentschel et al. .......... 257/288 |
| 2010/0099245 A1 | 4/2010 | Hyun et al. |
| 2010/0184260 A1* | 7/2010 | Luo et al. .................... 438/154 |
| 2011/0027955 A1 | 2/2011 | Woon et al. |
| 2011/0147850 A1 | 6/2011 | Nandakumar et al. |
| 2011/0223756 A1 | 9/2011 | Schaeffer et al. |
| 2011/0248361 A1 | 10/2011 | Ito et al. |
| 2011/0306170 A1 | 12/2011 | Wang et al. |
| 2011/0306193 A1 | 12/2011 | Krull et al. |
| 2012/0001171 A1 | 1/2012 | Atanackovic |
| 2012/0032280 A1 | 2/2012 | Kirkpatrick et al. |
| 2012/0091533 A1 | 4/2012 | Kim et al. |
| 2012/0129330 A1 | 5/2012 | Kim et al. |
| 2012/0205720 A1 | 8/2012 | Forbes et al. |
| 2012/0214296 A1 | 8/2012 | Hyun et al. |
| 2012/0282760 A1 | 11/2012 | Kronholz et al. |
| 2012/0309144 A1* | 12/2012 | Do et al. ..................... 438/216 |
| 2014/0246732 A1* | 9/2014 | Chen et al. ................... 257/392 |

FOREIGN PATENT DOCUMENTS

| | | |
|---|---|---|
| JP | 4485754 B2 | 4/2010 |
| KR | 100807597 B1 | 2/2008 |

* cited by examiner

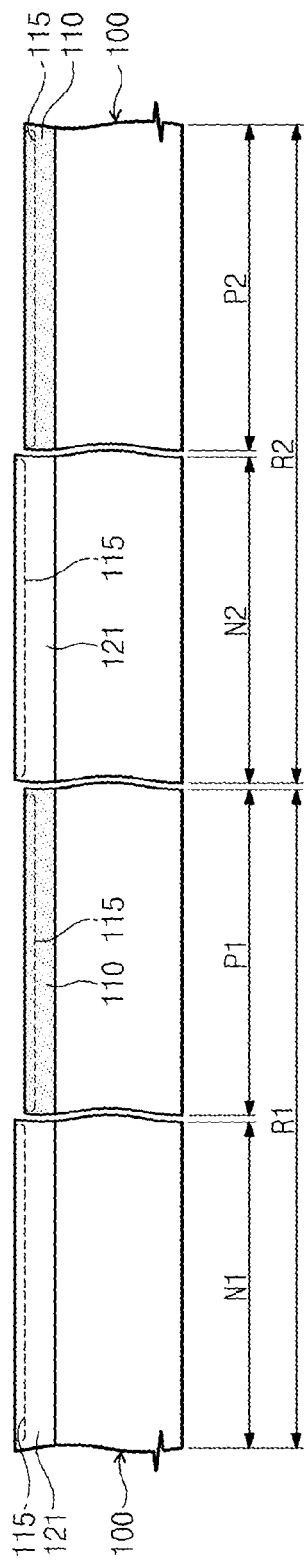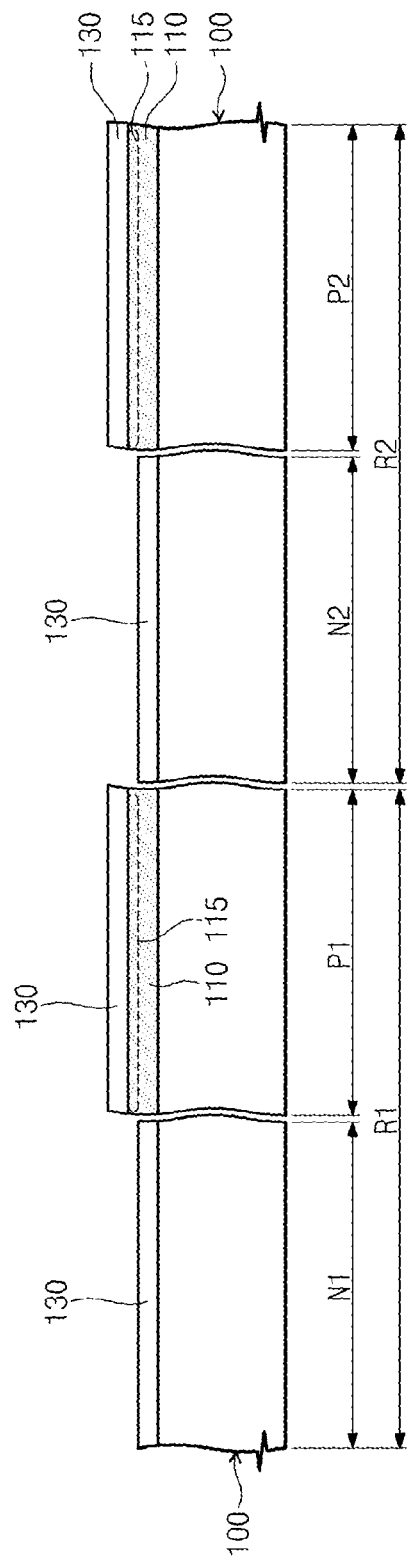

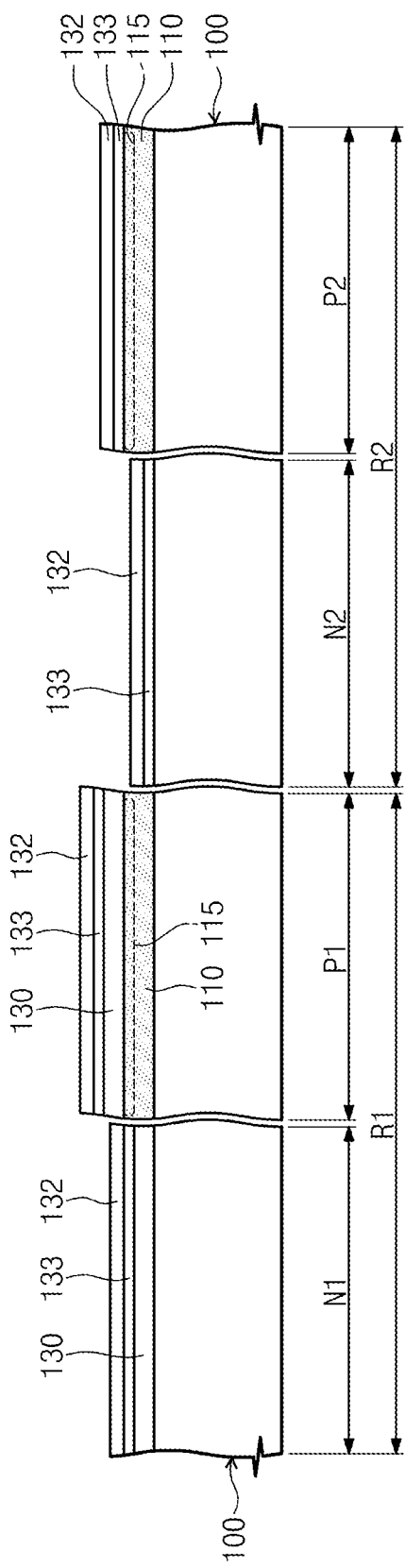

METHODS OF FABRICATING SEMICONDUCTOR DEVICES

CROSS-REFERENCE TO RELATED APPLICATIONS

This application is a divisional application of U.S. application Ser. No. 13/423,748, filed on Mar. 19, 2012, which claims priority under 35 U.S.C. §119 to Korean Patent Application No. 10-2011-0025474, filed on Mar. 22, 2011, the entire contents of which are hereby incorporated by reference.

BACKGROUND

1. Field

Some example embodiments herein relate to methods of fabricating the semiconductor devices, more particularly, methods of fabricating the semiconductor devices including a silicon-germanium layer.

2. Description of the Related Art

As the electronic industry becomes more developed, requirements for diverse characteristics of the semiconductor device have been increased. For example, requirements of higher reliability, higher speed, and/or multi-functional characteristics are increasing. For satisfying these requirements, the inner structure of the semiconductor device is becoming more complicated, and the integration density is therefore increasing.

SUMMARY

Some example embodiments provide methods of fabricating the semiconductor devices having improved electrical characteristics.

An example embodiment provides a method of fabricating a semiconductor device. The method includes preparing a substrate including an NMOS transistor region and a PMOS transistor region, forming a silicon-germanium layer on the PMOS transistor region, and injecting nitrogen atoms in an upper portion of the silicon-germanium layer. After injecting the nitrogen atoms, a first gate dielectric layer may be formed on the NMOS transistor region and the PMOS transistor region.

According to an example embodiment of the inventive concepts, the method may further include heat treating the first gate dielectric layer, and forming a gate electrode pattern on the first gate dielectric layer such that the silicon-germanium layer is exposed.

According to an example embodiment of the inventive concepts, the first gate dielectric layer may be heat treated before forming the gate electrode pattern.

According to an example embodiment of the inventive concepts, the method may further include forming a source region and a drain region in the silicon-germanium layer exposed by the gate electrode pattern.

According to an example embodiment of the inventive concepts, the method may further include etching the silicon-germanium layer exposed by the gate electrode pattern to form a recessed region in the PMOS transistor region, and forming a compressive stress pattern in the recessed region. The compressive stress pattern may include a silicon-germanium material.

According to an example embodiment of the inventive concepts, the method may further include forming a silicon capping layer on the silicon-germanium layer before forming the first gate dielectric layer.

According to an example embodiment of the inventive concepts, the first gate dielectric layer may be formed by thermally oxidizing the silicon capping layer.

According to an example embodiment of the inventive concepts, the nitrogen atoms may be injected before forming the silicon capping layer.

According to an example embodiment of the inventive concepts, the nitrogen atoms may be injected into an upper portion of the silicon-germanium layer in the PMOS transistor region, and an upper portion of the substrate in the NMOS transistor region.

According to an example embodiment of the inventive concepts, the nitrogen atoms may be injected to a depth below 10% of the thickness of the silicon-germanium layer from a top surface of the silicon-germanium layer.

According to an example embodiment of the inventive concepts, the nitrogen atoms are injected into an upper portion of the silicon-germanium layer such that the silicon-germanium layer has a nitrogen concentration of about $5\times10^{10}$ to about $2\times10^{16}$ atm/cm$^3$.

According to another example embodiment of the inventive concepts, the method includes preparing a substrate including a first region and a second region, forming a silicon-germanium layer on the first region and the second region, forming a nitrogen impurity region in an upper portion of the silicon-germanium layer, forming a first gate dielectric layer on the nitrogen impurity region, removing the first gate dielectric layer in the second region, and forming a second gate dielectric layer on the first region and the second region.

According to another example embodiment of the inventive concepts, the method may further include heat treating the first gate dielectric layer. The nitrogen impurity region may be formed before heat treating the first gate dielectric layer.

According to another example embodiment of the inventive concepts, the second gate dielectric layer may include a high-k dielectric layer having a higher dielectric constant than that of a silicon oxide layer.

According to another example embodiment of the inventive concepts, the method may further include forming a third gate dielectric layer between the first gate dielectric layer and the second gate dielectric layer. The third gate dielectric layer may include a silicon oxynitride layer.

According to yet another example embodiment of the inventive concepts, a method of manufacturing a semiconductor device includes forming a silicon-germanium layer on one of first and second regions of a substrate, forming a nitrogen impurity region in an upper portion of the silicon-germanium layer, and forming at least one gate dielectric layer on the nitrogen impurity region.

According to another example embodiment of the inventive concepts, the nitrogen impurity region may be formed to a depth below 10% of the thickness of the silicon-germanium layer from a top surface of the silicon-germanium layer. According to another example embodiment of the inventive concepts, the nitrogen impurity region may have a nitrogen concentration of about $5\times10^{10}$ to about $2\times10^{16}$ atm/cm$^3$.

According to another example embodiment of the inventive concepts, the at least one gate dielectric layer may include at least one of hafnium, tantalum, and silicon. According to another example embodiment of the inventive concepts, the at least one gate dielectric layer may include first, second and third gate dielectric layers, and the second and third gate dielectric layers may be thinner than the first gate dielectric layer.

BRIEF DESCRIPTION OF THE DRAWINGS

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the drawings:

FIGS. 16 through 19 are cross-sectional views illustrating a method of fabricating the semiconductor device according to the third example embodiment of the present inventive concepts.

DETAILED DESCRIPTION OF EXAMPLE EMBODIMENTS

Figure 1:
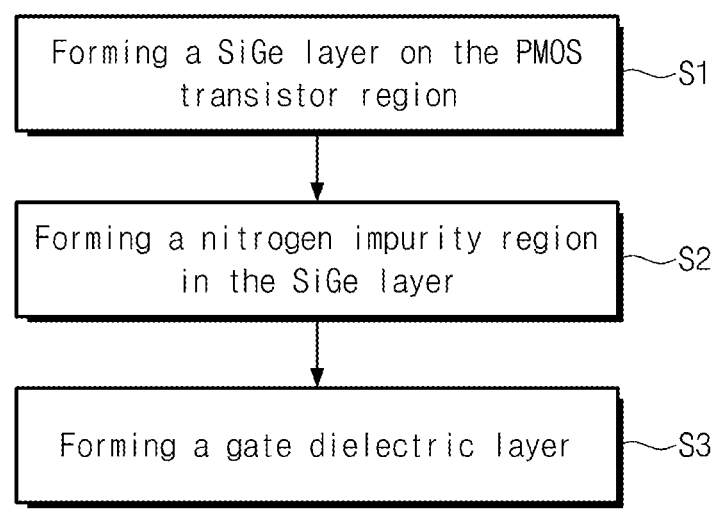
FIG. 1 is a flow chart illustrating a method of fabricating the semiconductor device according to a first example embodiment of the present inventive concepts.

Features and advantages of the inventive concepts will be better understood from the following description of example embodiments taken in conjunction with the accompanying drawings. The inventive concepts may, however, be embodied in different forms and should not be construed as limited to the example embodiments set forth herein. Rather, these example embodiments are provided so that this disclosure will be thorough and complete, and will fully convey the scope of the inventive concepts to those skilled in the art.

In the specification, it will be understood that when a layer (or film) is referred to as being 'on' another layer or substrate, it can be directly on the other layer or substrate, or intervening layers may also be present. In the drawings, the dimensions of layers and regions are exaggerated for clarity of illustration. Also, though terms like a first, a second, and a third are used to describe various regions and layers in various example embodiments of the inventive concepts, the regions and the layers are not limited to these terms. These terms are used only to discriminate one region or layer from another region or layer. Therefore, a layer referred to as a first layer in one example embodiment can be referred to as a second layer in another example embodiment. An example embodiment described and exemplified herein includes a complementary example embodiment thereof. As used herein, the term 'and/or' includes any and all combinations of one or more of the associated listed items. Like reference numerals refer to like elements throughout.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

FIG. 1 is a flow chart illustrating a method of fabricating the semiconductor device according to a first example embodiment of the present inventive concepts. FIGS. 2 through 5 are cross-sectional views illustrating a method of fabricating the semiconductor device according to the first example embodiment of the present inventive concepts.

Figure 2:
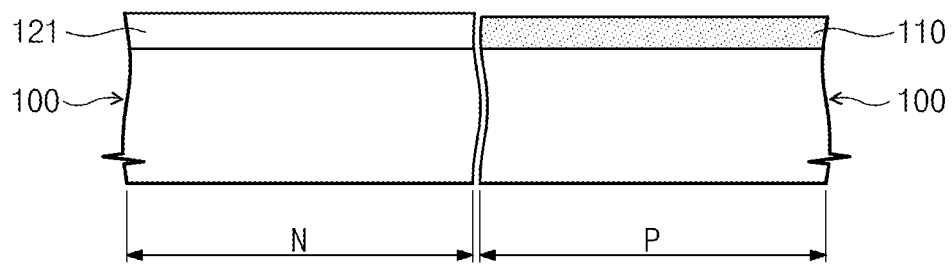
FIGS. 2 through 5 are cross-sectional views illustrating a method of fabricating the semiconductor device according to the first example embodiment of the present inventive concepts.

Referring to FIGS. 1 and 2, a substrate 100 including an NMOS transistor region N and a PMOS transistor region P may be prepared. The substrate 100 is a substrate including a semiconductor material. For example, the substrate 100 may be a silicon substrate, germanium substrate, or silicon-germanium substrate, etc. The NMOS and PMOS transistor regions N, P are separated regions divided by device isolation patterns (not shown). The device isolation patterns may be formed by a shallow trench isolation process. For example, the device isolation patterns may be at least one of Borosilicate Glass (BSG), Phospho-Silicate Glass (PSG), Boro-Phospho-Silicate Glass (PBSG), Tetra-Ethyl-Ortho-Silicate (TEOS), Undoped Silicate Glass (USG), High Density Plasma (HDP), or Spin On Glass (SOG).

The substrate 100 in the NMOS transistor region N may be a slightly doped region with p-type dopants, the substrate 100 in the PMOS transistor region may be a slightly doped region with n-type dopants. For example, the PMOS transistor region P may be formed by implanting n-type dopants to a predetermined or given depth from a top surface of the substrate.

A silicon-germanium layer 110 may be formed on the PMOS transistor region P (S1). For instance, the silicon-germanium layer 110 may be formed by a Selective Epitaxial Growth (SEG) process. The germanium to silicon ratio of an upper portion and a lower portion of the silicon-germanium layer 110 may be substantially same. Alternatively, the germanium to silicon ratio of the upper portion and the lower portion of the silicon-germanium layer 110 may be different. For example, the germanium to silicon ratio of the upper portion of the silicon-germanium layer 110 may be higher than that of the lower portion. The silicon-germanium layer 110 may be formed on the top surface of the substrate 100, or formed in a recessed region (not shown) in the substrate 100. The recessed region may be formed by etching an upper portion of the substrate 100.

The silicon-germanium layer 110 may be doped with n-type dopants in-situ. Alternatively, the silicon-germanium layer 110 may be doped by an ion implanting process.

During the SEG process, epitaxial growth on the NMOS transistor region N may be prevented or inhibited by an epitaxial protecting layer 121. The epitaxial protecting layer 121 may comprise at least one of silicon nitride, silicon oxynitride, or silicon oxide.

Figure 3:
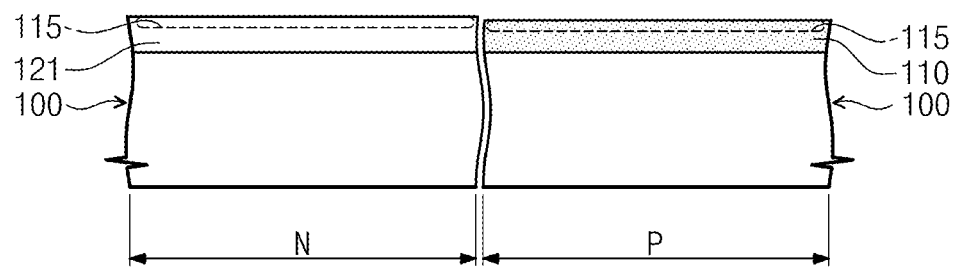

Referring to FIGS. 1 and 3, a nitrogen impurity region 115 may be formed in the upper portion of the silicon-germanium layer 110 by injecting nitrogen atoms (S2). As an illustration, the depth of the nitrogen impurity region 115 may be below 10% of the thickness of the silicon-germanium layer from a top surface of the silicon-germanium layer. For example, a nitrogen concentration of the nitrogen impurity region 115 may be about $5 \times 10^{10}$ to about $2 \times 10^{16}$ atm/cm$^3$. The nitrogen concentration of the nitrogen impurity region 115 may decrease from the upper portion to the lower portion of the nitrogen impurity region 115.

The nitrogen impurity region 115 may be formed by an ion implanting process or a thermal diffusion process. For example, the nitrogen impurity region 115 may be formed by a Decoupled Plasma Nitridation (DPN) process or Nitric Oxide Annealing (N—O Annealing). When the nitrogen impurity region 115 is formed by an ion implanting process, a first heat treatment may be performed after the implanting process. The nitrogen impurity region 115 may be formed in the epitaxial protecting layer 121 on the NMOS transistor region N. In this case, the epitaxial protecting layer 121 may be used as an ion implanting mask.

Figure 4:
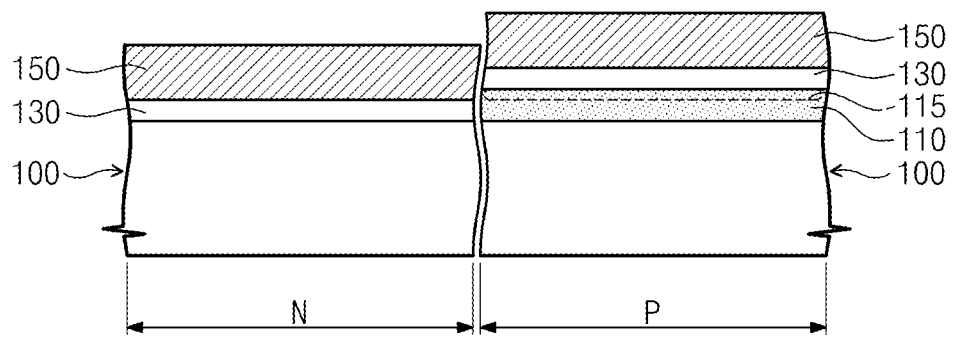

Referring to FIGS. 1 and 4, a first gate dielectric layer 130 may be formed on the NMOS and PMOS transistor regions N, P (S3). The epitaxial protecting layer 121 may be removed before forming the first gate dielectric layer 130. The first gate dielectric layer 130 may contact the nitrogen impurity region 115 in the silicon-germanium layer 110. For example, the first gate dielectric layer 130 may be formed by deposition technique such as Chemical Vapor Deposition (CVD), Physical Vapor Deposition (PVD), or Atomic Layer Deposition (ALD). Forming the first gate dielectric layer 130 may include a second heat treatment. The density of the first gate dielectric layer 130 may increase through the second heat treatment. The second heat treatment may be performed before forming of a gate conductive layer described below.

In an example embodiment, the first gate dielectric layer 130 may be formed by a thermal oxidation process. For example, the first gate dielectric layer 130 may be formed by a Rapid Thermal Process (RTP). The first gate dielectric layer 130 may include a silicon oxide layer or a silicon oxynitride layer. The first gate dielectric layer 130 may include a plurality of dielectric layers. For example, the gate dielectric layer may include one of a hafnium oxide ($HfO_x$) layer, a tantalum oxide ($TaO_x$) layer having a high dielectric constant, or a silicon oxide ($SiO_2$) layer.

A gate conductive layer 150 may be formed on the first gate dielectric layer 130. The gate conductive layer 150 may comprise at least one of metal such as Al or Cu, or doped poly silicon. The gate conductive layer 150 may be formed by CVD or PVD.

A plurality of high temperature processes may be performed after forming the silicon-germanium layer 110. For example, forming the first gate dielectric layer 130 may be accompanied with the second heat treatment. The plurality of high temperature processes may increase a formation of the germanium oxide in an interface between the first gate dielectric layer 130 and the silicon germanium layer 110. Accordingly, the germanium oxide may be distributed at a greater depth from the top surface of the silicon germanium layer 110. The germanium oxide may deteriorate electrical characteristics of a semiconductor device. For example, when the silicon germanium layer 110 is used as a channel of a semiconductor device, a leakage current of the semiconductor device may increase by the germanium oxide. Moreover, a profile of the germanium oxide depends on the high temperature processes. Therefore, the electrical characteristics of the semiconductor device may be dispersed differently because of an unexpected distribution of the germanium oxide.

According to an example embodiment of the present inventive concepts, the nitrogen impurity region 115 may be presented in the upper portion of the silicon-germanium layer 110, so that the formation of the germanium oxide during the thermal process thereafter may be prevented or inhibited. Nitrogen atoms in the nitrogen impurity region 115 may have relatively greater bonding strength with germanium atoms than a bonding strength between oxygen atoms and germanium atoms. Accordingly, formation of the germanium oxide may decrease and deterioration of the electrical characteristics such as the leakage current may be prevented or inhibited.

Figure 5:
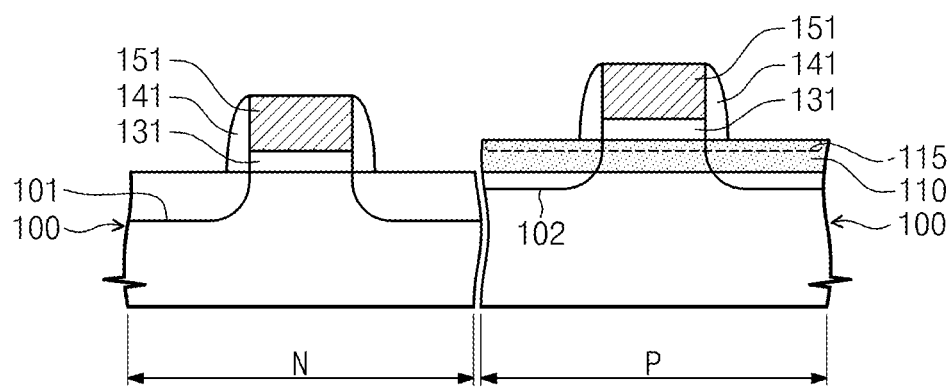

Referring to FIG. 5, gate structures may be formed on the PMOS and NMOS transistor regions P, N respectively. The first gate dielectric layer 130 and the gate conductive layer 150 may be patterned to form first gate dielectric patterns 131 and gate electrode patterns 151. Gate spacers 141 may be formed on the sidewalls of the first gate dielectric patterns 131 and the first gate electrode patterns 151. The gate spacers 141 may include at least one of silicon oxide, silicon nitride or silicon oxynitride. First source/drain regions 101 may be formed in the NMOS transistor region N, and second source/drain regions 102 may be formed in the PMOS transistor region P. The first source/drain regions 101 may be a heavily doped region with n-type dopants, and the second source/drain regions 102 may be a heavily doped region with p-type dopants. The first and second source/drain regions 101, 102 may be formed by a plurality of ion implantations using the gate electrode patterns 151 and the gate spacers 141 as an ion implanting mask.

A channel region may be defined by the first and second source/drain regions 101, 102 respectively. A portion of the silicon germanium layer 110 may be the channel region in the PMOS transistor region P. The silicon-germanium layer 110 may have a relatively narrow gap compared with that of a silicon layer. Accordingly, when the silicon-germanium layer 110 is used as a channel region, threshold voltage Vt may decrease. Moreover, carrier mobility of the silicon-germanium layer 110 may be higher than that of a silicon layer.

According to an example embodiment of the present inventive concepts, a portion of the silicon-germanium layer 110 may be used as source/drain regions. For example, a bottom surface of the second source/drain regions 102 may be lower than that of the silicon-germanium layer 110.

According to an example embodiment of the present inventive concepts, the nitrogen impurity region 115 may be formed in the upper portion of the silicon-germanium layer 110, so that the formation of the germanium oxide may be prevented or inhibited. Accordingly, deterioration of the electrical characteristics of the semiconductor device may be prevented or inhibited.

Figure 6:
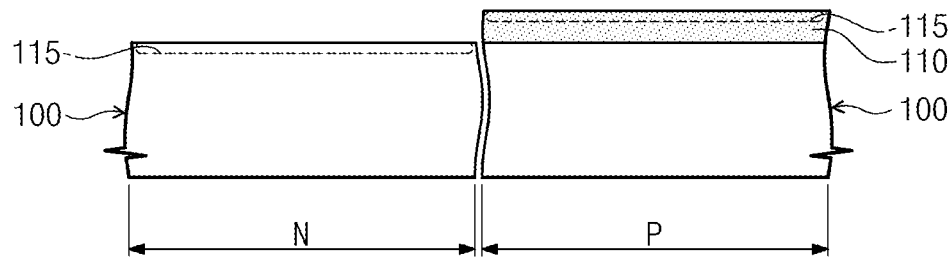
FIGS. 6 through 8 are cross-sectional views illustrating a modified method of fabricating the semiconductor device according to the first example embodiment of the present inventive concepts.
Figure 7:
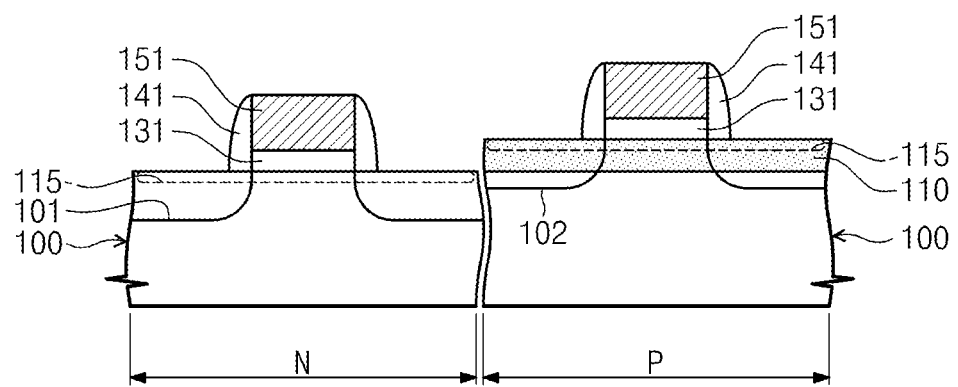
Figure 8:
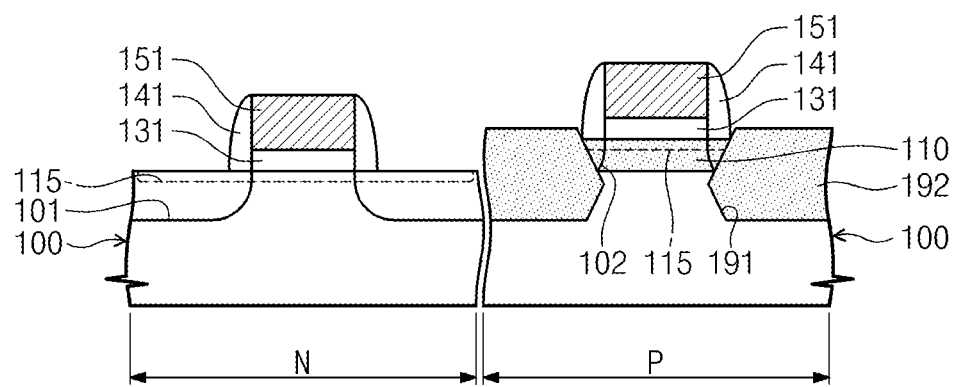

FIGS. 6 through 8 are cross-sectional views illustrating a modified method of fabricating the semiconductor device according to another example embodiment of the present inventive concepts. For brevity of description, the description of the same technical matter and structure will be omitted.

Referring to FIG. 6, a substrate 100 including an NMOS transistor region N and a PMOS transistor region P may be prepared. A silicon-germanium layer 110 may be formed on the PMOS transistor region P. The NMOS transistor region N may be masked with the epitaxial protecting layer (not shown) before forming the silicon-germanium layer 110. The epitaxial protecting layer may be removed after forming the silicon-germanium layer 110.

For instance, the silicon-germanium layer 110 may be formed by a Selective Epitaxial Growth (SEG) process. The germanium to silicon ratio of an upper portion and a lower portion of the silicon-germanium layer 110 may be substantially the same. Alternatively, the germanium to silicon ratio of the upper portion and the lower portion of the silicon-germanium layer 110 may be different. For example, the germanium to silicon ratio of the upper portion of the silicon-germanium layer 110 may be higher than that of the lower portion.

The silicon-germanium layer 110 may be doped with n-type dopants in-situ. Alternatively, the silicon-germanium layer 110 may be doped by ion implanting process.

A nitrogen impurity region 115 may be formed in the upper portion of the silicon-germanium layer 110 by injecting nitrogen atoms. As an illustration, the depth of the nitrogen impurity region 115 may be below 10% of the thickness of the silicon-germanium layer from a top surface of the silicon-germanium layer. For example, a nitrogen concentration of the nitrogen impurity region 115 may be about $5\times10^{10}$ to about $2\times10^{16}$ atm/cm$^3$.

The nitrogen concentration of the nitrogen impurity region 115 may decrease from the upper portion to the lower portion of the nitrogen impurity region 115. The nitrogen impurity region 115 may be formed by an ion implanting process or a thermal diffusion process. For example, the nitrogen impurity region 115 may be formed by a Decoupled Plasma Nitridation (DPN) process or a Nitric Oxide Annealing (N—O Annealing) process. When the nitrogen impurity region 115 is formed by an ion implanting process, a first heat treatment may be performed after the implanting process.

During the injection of nitrogen atoms on the PMOS transistor region P, the nitrogen atoms may be injected to an upper portion of the substrate 100 in the NMOS transistor region N. Accordingly, the nitrogen impurity region 115 may be formed in the upper portion of the substrate 100 in the NMOS transistor region N.

Referring to FIG. 7, gate structures may be formed on the PMOS and NMOS transistor regions P, N respectively. First gate dielectric patterns 131 and gate electrode patterns 151 may be formed, and gate spacers 141 may be formed on the sidewalls of the first gate dielectric patterns 131 and the first gate electrode patterns 151. The first gate dielectric pattern 131 may contact the nitrogen impurity region 115 in the silicon-germanium layer 110.

First source/drain regions 101 may be formed in the NMOS transistor region N, and second source/drain regions 102 may be formed in the PMOS transistor region P. The silicon-germanium layer 110 may be a portion of a channel region in the PMOS transistor region P. In an example embodiment, the first source/drain regions 101 and the channel region interposed therebetween may have nitrogen atoms.

Referring to FIG. 8, after forming a recessed region 191 in the PMOS transistor region P, a compressive stress pattern 192 may be formed to fill the recessed region 191. The NMOS transistor region N may be protected by an etching protecting layer (not shown) while forming the recessed region 191. The recessed region 191 may be formed by an anisotropic etch process. The recessed region 191 may be formed by a wet etching process having directivity. The wet etching process having directivity may use selected crystal planes among the crystal planes of the substrate 100 as an etch stop surface. For example, the wet etching process may use a {111} crystal planes of the substrate 100 as an etch stop surface.

Therefore, a vertical cross section of the recessed region 191 may be tapered toward the channel region below the gate electrode patterns 151. The wet etching process may use etchant having directivity comprising ammonia and/or tetramethyl-ammonium hydroxide TMAH, etc., when the substrate 100 is a silicon substrate. At least a portion of the second source/drain regions 102 may be removed by forming the recessed region 191.

In an example embodiment, the recessed region 191 may be formed by an anisotropic dry etch using an etching gas having a directivity in a predetermined or given direction. For example, the dry etch process comprises an etching process using an etching gas having a directivity in a direction having an acute angle to a direction perpendicular to the substrate 100.

The compressive stress pattern 192 may be formed in the recessed region 191 by a SEG process. For example, the compressive stress pattern 192 may include a silicon-germanium material. An epitaxial protecting layer (not shown) may be formed on the NMOS transistor region N before forming the compressive stress pattern 192. The compressive stress pattern 192 may be doped with p-type dopants by an in-situ method. Alternatively, the compressive stress pattern 192 may be doped with p-type dopants by ion implantation process after forming the compressive stress pattern 192.

The compressive stress pattern 192 may be grown to be higher than a top surface of the silicon-germanium layer 110. For example, a top surface of the compressive stress pattern 192 may be higher than the top surface of the silicon-germanium layer 110. Thus, a portion of sidewall of the compressive stress pattern 192 upwardly protrudes from the silicon-germanium layer 110. The compressive stress pattern 192 may increase mobility of carriers in the PMOS transistor region P.

Figure 9:
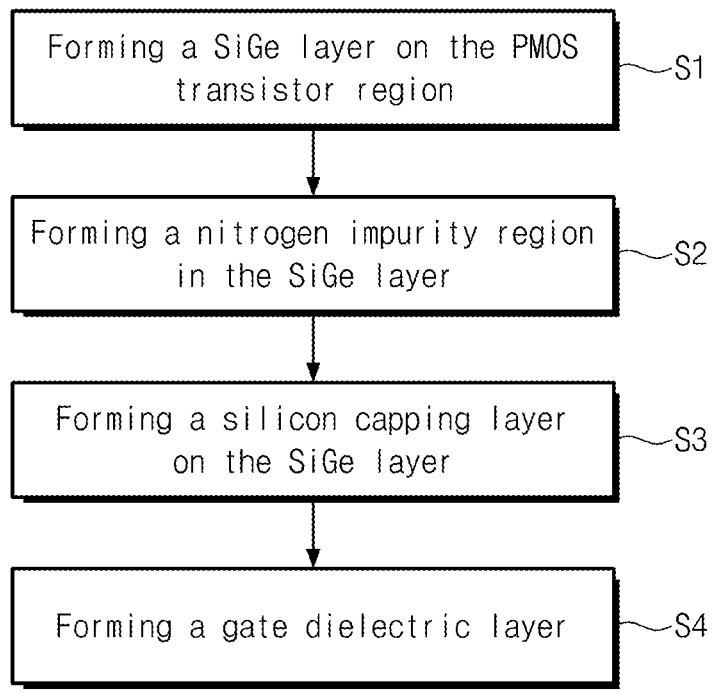
FIG. 9 is a flow chart illustrating a method of fabricating the semiconductor device according to a second example embodiment of the present inventive concepts.
Figure 10:
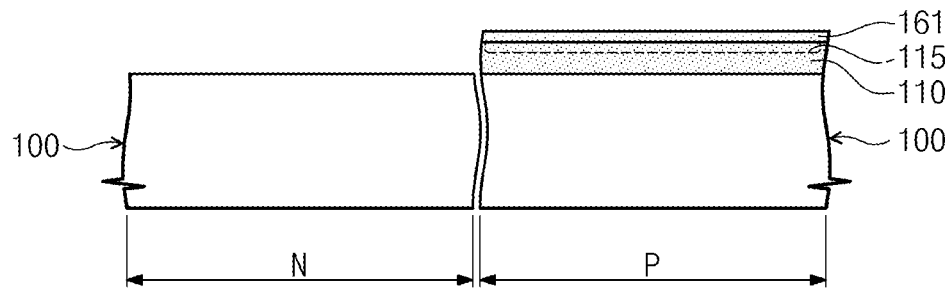
FIGS. 10 through 11 are cross-sectional views illustrating a method of fabricating the semiconductor device according to the second example embodiment of the present inventive concepts.
Figure 11:
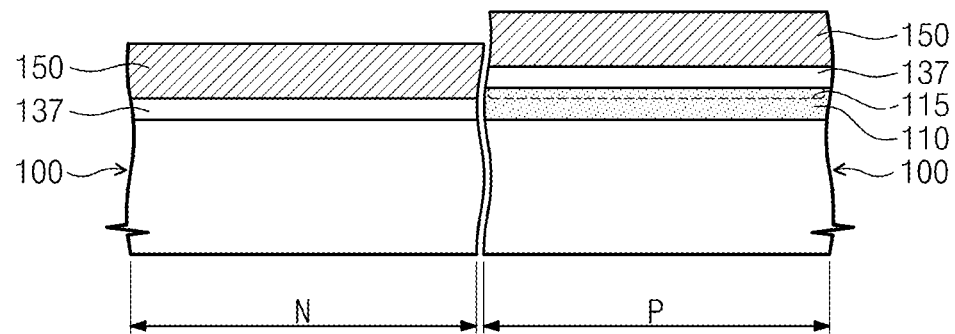

FIG. 9 is a flow chart illustrating a method of fabricating the semiconductor device according to a second example embodiment of the present inventive concepts. FIG. 10 through 11 are cross-sectional views illustrating a method of fabricating the semiconductor device according to a second example embodiment of the present inventive concepts. For brevity of description, the description of the same technical matter and structure will be omitted.

Referring to FIGS. 9 and 10, a substrate 100 including an NMOS transistor region N and a PMOS transistor region P may be prepared. A silicon-germanium layer 110 may be formed on the PMOS transistor region P (S1). For instance, the silicon-germanium layer 110 may be formed by a Selective Epitaxial Growth (SEG) process. The silicon-germanium layer 110 may be doped with n-type dopants in-situ. Alternatively, the silicon-germanium layer 110 may be doped by an ion implanting process.

A nitrogen impurity region 115 may be formed in the upper portion of the silicon-germanium layer 110 by injecting nitrogen atoms (S2). As an illustration, the depth of the nitrogen impurity region 115 may be below 10% of the thickness of the silicon-germanium layer from a top surface of the silicon-germanium layer. For example, a nitrogen concentration of the nitrogen impurity region 115 may be about $5\times10^{10}$ to about $2\times10^{16}$ atm/cm$^3$. The nitrogen concentration of the nitrogen impurity region 115 may decrease from the upper portion to the lower portion of the nitrogen impurity region 115. The nitrogen impurity region 115 may be formed by ion implanting process or thermal diffusion process. For example, the nitrogen impurity region 115 may be formed by Decoupled Plasma Nitridation (DPN) process or Nitric Oxide Annealing (N—O Annealing process. When the nitrogen impurity region 115 is formed by an ion implanting process, a first heat treatment may be performed after the implanting process.

A silicon capping layer 161 may be formed on the silicon-germanium layer 110 (S3). For example, the silicon capping layer 161 may be formed after forming the nitrogen impurity region 115. The silicon capping layer 161 may be in an intrinsic state. The silicon capping layer 161 may contact the nitrogen impurity region 115. The silicon capping layer 161 may be formed by a deposition process such as CVD. The silicon capping layer 161 may be thinner than the silicon-germanium layer 110. The substrate 100 in NMOS transistor region N may be exposed by removing the epitaxial protecting layer after forming the silicon capping layer 161. The silicon capping layer 161 formed on the epitaxial protecting layer may be removed with the epitaxial protecting layer.

Referring to FIGS. 9 and 11, a first gate dielectric layer 137 may be formed (S4). The first gate dielectric layer 137 may be formed by oxidation process. In the NMOS transistor region N, the first gate dielectric layer 137 may be formed from an exposed upper portion of the substrate 100. In the PMOS transistor region P, the first gate dielectric layer 137 may be formed from the upper portion of the silicon capping layer 161 by an oxidation process. Therefore, the first gate dielectric layer 137 in the PMOS transistor region P may be formed from a silicon material, not from the silicon germanium layer 110. A gate conductive layer 150 may be formed on the first gate dielectric layer 137. The gate structure described in the FIG. 5 may be formed thereafter.

Figure 12:
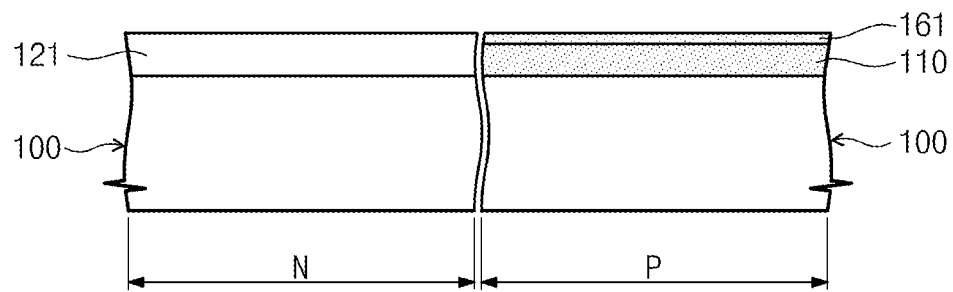
FIGS. 12 through 14 are cross-sectional views illustrating a modified method of fabricating the semiconductor device according to the second example embodiment of the present inventive concepts.
Figure 13:
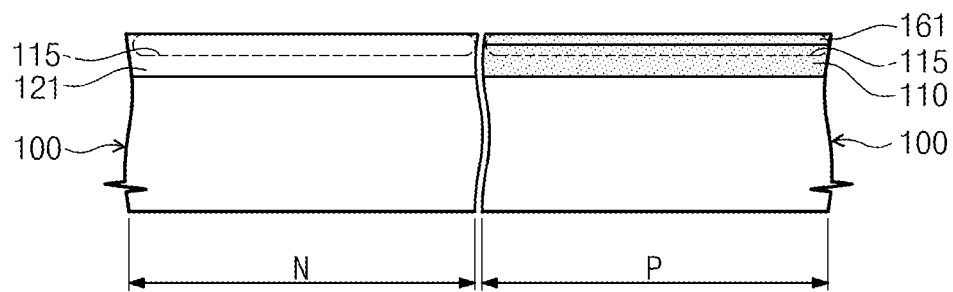
Figure 14:
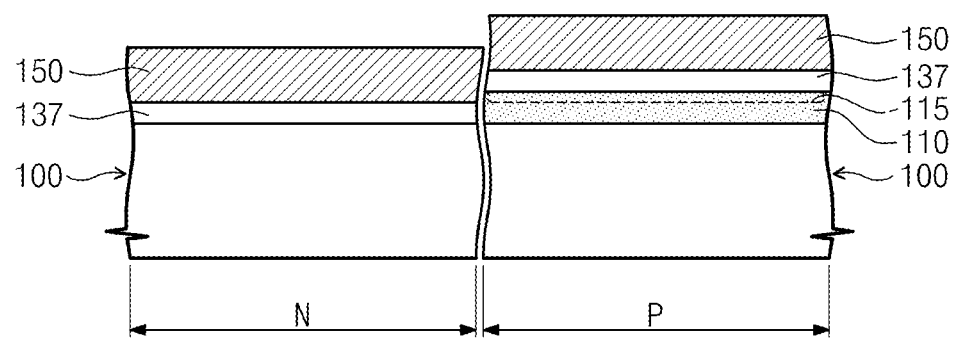

FIGS. 12 through 14 are cross-sectional views illustrating a modified method of fabricating the semiconductor device according to a second example embodiment of the present inventive concepts.

Referring to FIG. 12, a silicon capping layer 161 may be formed on the silicon-germanium layer 110 described in FIG. 2. The silicon capping layer 161 may be formed by a deposition process such as CVD. The silicon capping layer 161 may be thinner than the silicon-germanium layer 110.

Referring to FIG. 13, a nitrogen impurity region 115 may be formed in the silicon capping layer 161 and the silicon-germanium layer 110. For example, the nitrogen impurity region 115 may be formed after forming the silicon capping layer 161. At least a portion of the silicon capping layer 161 may be doped with nitrogen atoms together with an upper portion of the silicon-germanium layer 110. The nitrogen impurity region 115 may be formed in an upper portion of an epitaxial protecting layer 121.

Referring to FIG. 14, a first gate dielectric layer 137 and a gate conductive layer 150 may be formed. The epitaxial protecting layer 121 may be removed before forming the first gate dielectric layer 137. For example, the first gate dielectric layer 137 may be formed by a thermal oxidation process. The silicon capping layer 161 may include the nitrogen atoms, so that the first gate dielectric layer 137 in the PMOS transistor region P formed from the silicon capping layer 161 may include the nitrogen atoms. By contrast, the first gate dielectric layer 137 in the NMOS transistor region N may not include the nitrogen atoms. The gate structure described in the FIG. 5 may be formed thereafter.

Figure 15:
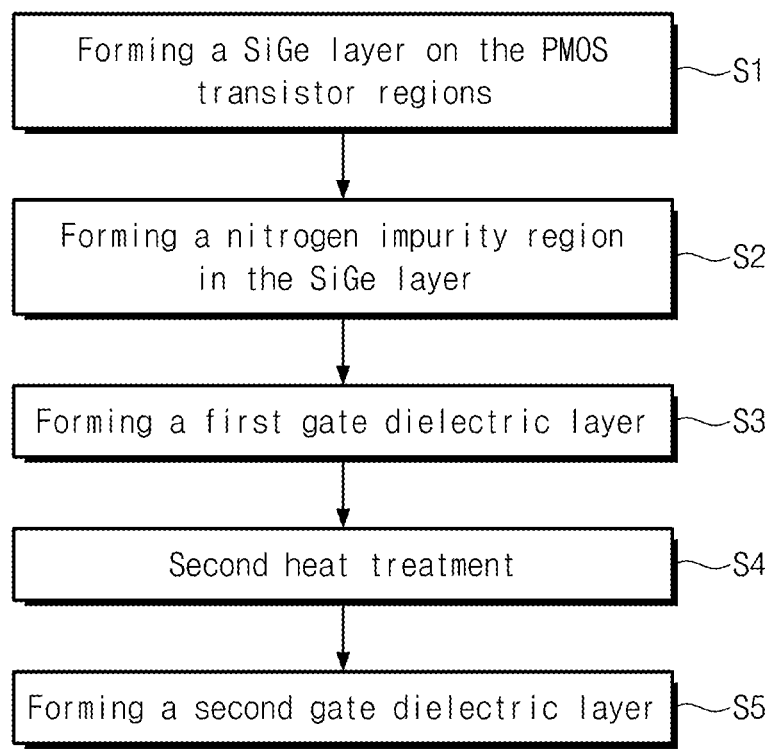
FIG. 15 is a flow chart illustrating a method of fabricating the semiconductor device according to a third example embodiment of the present inventive concepts.

FIG. 15 is a flow chart illustrating a method of fabricating the semiconductor device according to a third example embodiment of the present inventive concepts. FIG. 16 through 19 are cross-sectional views illustrating a method of fabricating the semiconductor device according to the third example embodiment of the present inventive concepts.

Referring to FIGS. 15 and 16, a substrate 100 comprises a first region R1 and a second region R2 may be prepared. The first and second region R1, R2 may be regions with gate dielectric layers having different thicknesses and/or different materials. The first and second region R1, R2 may be divided by the device isolation pattern (not shown). The first region R1 may include a first NMOS transistor region N1 and a first PMOS transistor region P1, and the second region F2 may include a second NMOS transistor region N2 and second PMOS transistor region N2.

A silicon-germanium layer 110 may be formed on the first and second PMOS regions P1, P2 (S1). For example, the silicon-germanium layer 110 may be formed by SEG process. The silicon-germanium layer 110 may be doped with n-type dopants in-situ. Alternatively, the silicon-germanium layer 110 may be doped by ion implanting process. During the SEG process, epitaxial growth on the first and second NMOS transistor regions N1, N2 may be prevented or inhibited by an epitaxial protecting layer 121.

A nitrogen impurity region 115 may be formed in the upper portion of the silicon-germanium layer 110 by injecting nitrogen atoms (S2). As an illustration, the depth of the nitrogen impurity region 115 may be below 10% of the thickness of the silicon-germanium layer from a top surface of the silicon-germanium layer. For example, a nitrogen concentration of the nitrogen impurity region 115 may be about $5 \times 10^{10}$ to about $2 \times 10^{16}$ atm/cm$^3$. The nitrogen concentration of the nitrogen impurity region 115 may decrease from the upper portion to the lower portion of the nitrogen impurity region 115. The nitrogen impurity region 115 may be formed by an ion implanting process or a thermal diffusion process. For example, the nitrogen impurity region 115 may be formed by a Decoupled Plasma Nitridation (DPN) process or a Nitric Oxide Annealing (N—O Annealing) process. When the nitrogen impurity region 115 is formed by an ion implanting process, a first heat treatment may be performed after the implanting process. The nitrogen impurity region 115 may be formed in the epitaxial protecting layer 121 on the NMOS transistor region N.

Referring to FIGS. 15 and 17, a first gate dielectric layer 130 may be formed on the first and second regions R1, R2 (S3). For example, the first gate dielectric layer 130 may be formed by deposition technique such as Chemical Vapor Deposition (CVD). A second heat treatment may be performed after forming the first gate dielectric layer 130 (S4). The density of the first gate dielectric layer 130 may increase through the second heat treatment. The epitaxial protecting layer 121 may be removed before forming the first gate dielectric layer 130.

Referring to FIGS. 15 and 18, the first gate dielectric layer 130 on the second region R2 may be removed. The removal of the first gate dielectric layer 130 may comprise a selective etching process. A second gate dielectric layer 132 may be formed after removing the first gate dielectric layer 130 on the second region R2 (S5). The second gate dielectric layer 132 may comprise a plurality of layers. For example, the second gate dielectric layer 132 may comprise at least one of a hafnium oxide (HfO$_x$) layer, a tantalum oxide (TaO$_x$) layer having high dielectric constant, or a silicon oxide (SiO$_2$) layer.

The second gate dielectric layer 132 may be formed by CVD or ALD. A third gate dielectric layer 133 may be formed between the first and second gate dielectric layers 130, 132. For example, the third gate dielectric 133 may be a silicon oxynitride layer. The second and third gate dielectric layers 132, 133 may be thinner than the first gate dielectric layer 130. The second and third gate dielectric layers 132, 133 may be formed on the first gate dielectric layer 130 on the first region R1. In another example embodiment, the second and third gate dielectric layers 132, 133 may be formed only on the second region R2.

Figure 19:
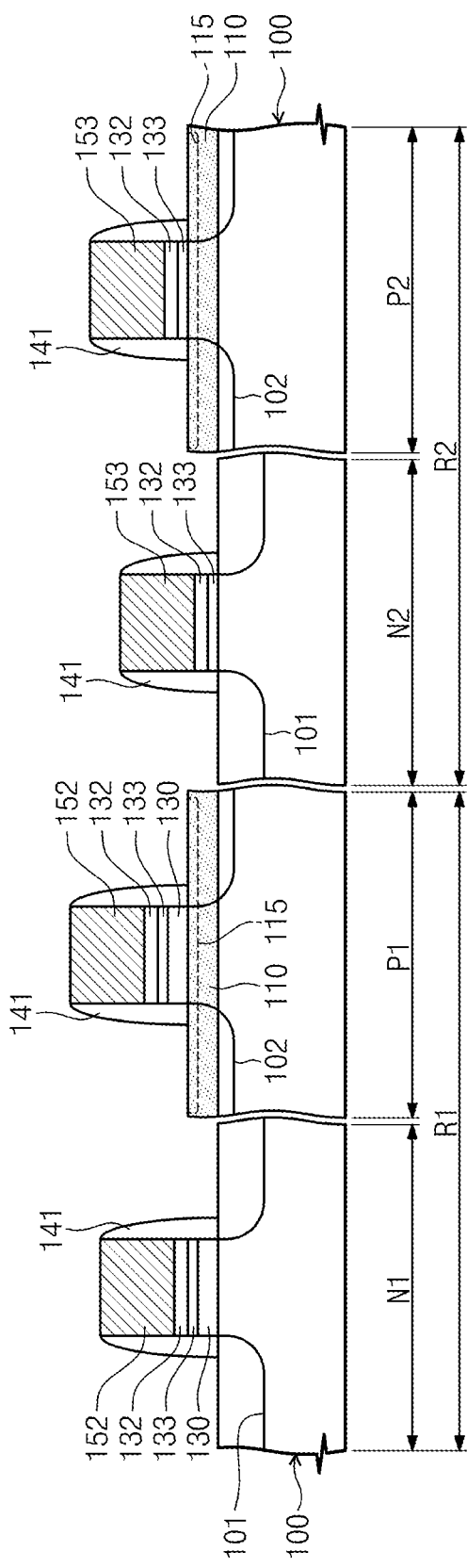

Referring to FIG. 19, gate structures may be formed on the first and second regions R1, R2 respectively. The gate structure on the first region R1 may comprise the first to third gate dielectric layers 130, 132, and 133, and a first gate electrode pattern 152. For example, the first gate electrode pattern 152 may comprise a doped poly silicon layer. The gate structure on the second region R2 may comprise the second and third gate dielectric layers 132, 133, and a second gate electrode pattern 153. For example, the second gate electrode pattern 153 may comprise a metal such as aluminum and/or copper. A diffusion barrier layer (not shown) may be provided between the second gate electrode pattern 153 and the second gate dielectric layer 132.

The diffusion barrier layer may comprise a conductive metal nitride layer such as titanium nitride layer or tungsten nitride layer. Gate spacers 141 may be formed on sidewalls of the gate electrode patterns 152, 153. A first source/drain regions 101 may be formed in the first and second NMOS transistor regions N1, N2 and a second source/drain regions 102 may be formed in the first and second PMOS regions P1, P2. The first source/drain regions 101 may be regions doped with n-type dopants, and the second source/drain regions 102 may be regions doped with p-type dopants.

According to some example embodiments of the present inventive concepts, the nitrogen impurity region 115 may be presented in the upper portion of the silicon-germanium layer 110, so that the formation of the germanium oxide during the thermal process thereafter may be prevented or inhibited. Accordingly, formation of the germanium oxide may decrease and deterioration of the electrical characteristics such as the leakage current may be prevented or inhibited. Moreover, gate dielectric layers having different thicknesses and/or different materials may be formed.

Although a few example embodiments of the present general inventive concepts have been shown and described, it will be appreciated by those skilled in the art that changes may be made in these embodiments without departing from the principles and spirit of the general inventive concept, the scope of which is defined in the appended claims and their equivalents. Therefore, the above-disclosed subject matter is to be considered illustrative, and not restrictive.

What is claimed is:

1. A method of fabricating a semiconductor device, the method comprising:
preparing a substrate including a first region and a second region;
forming a silicon-germanium layer on a first sub-region of the first region and a second sub-region of the second region;
forming a nitrogen impurity region in an upper portion of the silicon-germanium layer;
forming a first gate dielectric layer on the first region and the second region including the nitrogen impurity region;
heat treating the first gate dielectric layer after forming the first gate dielectric layer;
removing the first gate dielectric layer in the second region;
forming a second gate dielectric layer on the first region and the second region including the nitrogen impurity region; and
forming a third gate dielectric layer between the first gate dielectric layer and the second gate dielectric layer on the first region including the nitrogen impurity region and under the second gate dielectric layer on the second region including the nitrogen impurity region,
wherein the second and third gate dielectric layers are thinner than the first gate dielectric layer.

2. The method of claim 1, wherein the nitrogen impurity region is formed before the heat treating the first gate dielectric layer.

3. The method of claim 1, wherein the second gate dielectric layer includes a high-k dielectric layer having a higher dielectric constant than that of a silicon oxide layer.

4. The method of claim 3, wherein the third gate dielectric layer includes a silicon oxynitride layer.

5. The method of claim 1, wherein the nitrogen impurity region has a nitrogen concentration of about $5 \times 10^{10}$ to about $2 \times 10^{16}$ atm/cm$^3$.

6. The method of claim 1, wherein the second gate dielectric layer includes at least one of hafnium, tantalum, and silicon.

* * * * *